United States Patent
Eddy et al.

(10) Patent No.: US 6,753,688 B2
(45) Date of Patent: Jun. 22, 2004

(54) INTERCONNECT PACKAGE CLUSTER PROBE SHORT REMOVAL APPARATUS AND METHOD

(75) Inventors: Roger M. Eddy, Wappingers Falls, NY (US); Charles J. Hendricks, Wappingers Falls, NY (US); Thomas Morrison, Pleasant Valley, NY (US); Robert N. Wiggin, Poughkeepsie, NY (US); Brian J. Wojszynski, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 09/829,749

(22) Filed: Apr. 10, 2001

(65) Prior Publication Data

US 2002/0145434 A1 Oct. 10, 2002

(51) Int. Cl.[7] .................. G01R 31/02; G01R 31/08
(52) U.S. Cl. .................. 324/550; 324/523; 324/555
(58) Field of Search ................ 324/550, 523, 324/531, 555, 73.1

(56) References Cited

U.S. PATENT DOCUMENTS

| | | | | |
|---|---|---|---|---|
| 4,163,937 A | * | 8/1979 | Laass | 324/605 |
| 4,290,013 A | * | 9/1981 | Thiel | 324/555 |
| 4,342,959 A | * | 8/1982 | Skilling | 324/537 |
| 4,471,298 A | * | 9/1984 | Frohlich | 324/72.5 |
| 4,785,235 A | * | 11/1988 | Hendricks et al. | 324/73.1 |
| 5,103,557 A | * | 4/1992 | Leedy | 438/6 |
| 5,145,547 A | * | 9/1992 | Chen | 156/345.1 |
| 5,266,901 A | * | 11/1993 | Woo | 324/537 |
| 5,290,986 A | | 3/1994 | Colon et al. | 219/770 |
| 5,357,191 A | * | 10/1994 | Grace | 324/754 |
| 5,420,500 A | * | 5/1995 | Kerschner | 324/72.5 |
| 5,438,272 A | * | 8/1995 | Craig et al. | 324/537 |
| 5,570,027 A | * | 10/1996 | Stans et al. | 324/523 |
| 6,054,863 A | * | 4/2000 | Morrison et al. | 324/537 |
| 6,201,383 B1 | * | 3/2001 | Lo et al. | 324/73.1 |
| 6,288,561 B1 | * | 9/2001 | Leedy | 324/760 |

* cited by examiner

*Primary Examiner*—N. Le
*Assistant Examiner*—Timothy J. Dole
(74) *Attorney, Agent, or Firm*—James J. Cioffi, Esq.; McGinn & Gibb, PLLC

(57) ABSTRACT

A method and structure for an electronic circuit test and repair apparatus includes both of at least one wiring analyzer to locate circuit shorts and a current source to provide current sufficient to attempt to remove any identified shorts.

21 Claims, 4 Drawing Sheets

A few probes shown for illustration purposes only

INTERCONNECT PACKAGE CLUSTER PROBE SHORT REMOVAL APPARATUS AND METHOD

BACKGROUND OF THE INVENTION

1. Field of the Invention

The present invention generally relates to testing and repair of wiring interconnect packages. Specifically, a single apparatus performs not only a test for opens and shorts, but additionally provides the capability to make attempts to remove those shorts identified during the testing phase.

2. Description of the Related Art

Like any electronic component, wiring interconnect products (such as PC boards, substrates or other type of networks) can complete manufacture with one or more shorts.

Conventional systems that attempt to correct shorts in an interconnect package typically utilize one of several methods. First, the elements which exhibit the short defect are located by an electrical test and the physical location of the external portion of the elements, which can be probed, are recorded. A pair of probes are then manually brought into contact with the identified elements and a pulse of electrical energy is applied to the elements. The electrical energy is turned on externally by using a foot switch or other suitable means. Another method uses a pair of auto-programmed x, y, z motion probes and then auto-selects the pulsing operation.

Both methods require that the interconnect product be tested, the location of the short be recorded on paper, magnetic media or other suitable means, and that this information be conveyed to the short repair station. The first method is very time consuming and subject to mis-probing and product damage such as scratching and other handling errors. The second method requires a separate defect data format for each part (serialization) in addition to a separate and expensive mechanical positioning system.

U.S. Pat. No. 5,290,986 to Colon, et. al., incorporated herein by reference, describes a thermally driven process capable of eliminating inadvertent electrical connections in electronic packages using a current pulsing repair process.

Other methods might use manually-held probes for pulsing, or they may not use a process at all and would merely scrap the product without attempting a rework.

SUMMARY OF THE INVENTION

In view of the foregoing and other problems, it is, therefore, an object of the present invention to provide a structure and method for identifying opens and shorts, and eliminating the shorts in an interconnect package using the same machine and the same location in the manufacturing process.

It is another object of the present invention to simplify the identification and repair process for shorts on interconnect packages.

It is yet another object of the present invention to provide an automated technique of identification and elimination of shorts in an interconnect package.

It is yet another object of the present invention to provide an automated technique to retest a package following an attempt to eliminate an identified short.

It is yet another object to provide a method and apparatus that reduces manufacturing and testing time for interconnect packages.

It is yet another object to improve reliability of interconnect packages.

It is yet another object to improve yield of interconnect packages.

It is yet another object to provide a test/repair apparatus having a variety of possible testing/repair modes, so that an operator can choose the most efficient mode or modes depending upon type and characteristics of the product.

It is yet another object to provide a test/repair apparatus that reduces repair time compared to a manual process.

It is yet another object to provide a test/repair apparatus that allows a higher stress voltage to be applied during repair procedures than would be safe for a manual repair procedure.

In order to attain the above objects, according to one aspect of the invention, an electronic circuit test and repair apparatus, including at least one wiring analyzer to locate circuit shorts, a current source to provide current sufficient to remove the shorts, and at least two probes to contact a circuit on a product under evaluation.

According to another aspect of the invention, a method of testing and repair of wiring interconnect packages includes contacting at a predetermined set of locations a wiring interconnect package under test using a cluster probe containing a plurality of probes, applying a predetermined set of voltage levels in a predetermined sequence to predetermined probes in the cluster probe, measuring a response to each application of voltages to detect any abnormal open or short circuits in the wiring interconnect package, and for any detected short circuits, applying a predetermined voltage to attempt to remove the detected short circuit, wherein the applying of voltages and the measuring of responses to detect any short circuits uses a same apparatus that is used for the attempt to remove the short circuits.

According to yet another aspect of the invention, a method of automatically testing and repairing wiring interconnect packages, includes contacting at a predetermined set of locations a wiring interconnect package under test using a cluster probe containing a plurality of probes, automatically applying a predetermined set of voltage levels in a predetermined sequence to predetermined probes in the cluster probe, automatically measuring a response to each application of voltages to detect any abnormal open or short circuits in the wiring interconnect package, and, for any detected short circuits, automatically applying a predetermined voltage to attempt to remove the detected short circuit.

According to yet another aspect of the invention, an apparatus for testing and repair of wiring interconnect packages includes at least one wiring analyzer to locate circuit shorts, a current source to provide current sufficient to remove the shorts, and a cluster probe to contact a wiring interconnect package under evaluation.

The disclosed single-station test and repair apparatus and process provides the advantages of saving time and expense and helps eliminates logistics errors associated with multiple stations. The test and repair process can be either manually or automatically controlled and can have more than one testing speed. The automatic procedure provides safety for the operator since possible exposure to high voltage during testing or repair is eliminated. The cluster probe allows multiple points in a circuit to be contacted, thereby saving the time of repositioning probes. An overvoltage stress test capability provides additional reliability for repaired shorts.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Generally, a test and repair process and apparatus for shorts defects is provided for wiring interconnect products, such as PC boards, substrates or other type of networks. The process takes an untested packaging interconnect package, performs an open and short test and, if there are shorts, attempts a current pulsing repair, verifies that the short has been removed and then performs 100% retest.

In implementing the present invention to achieve the above-mentioned results, unique to this invention is the utilization of a cluster probe and a relay switching unit. The present invention eliminates all of the normally required handling of the product through multiple steps and processes, thus saving time and eliminating the risk of mis-handling and erroneously sorting good/bad product. The same fixturing that handles and tests the product is also used for the repair step.

Although shorts elimination is not always possible, the present invention has a proven track record of significantly improving yield on the Assignee's alumina ceramic substrate interconnect packages.

Figure 1:
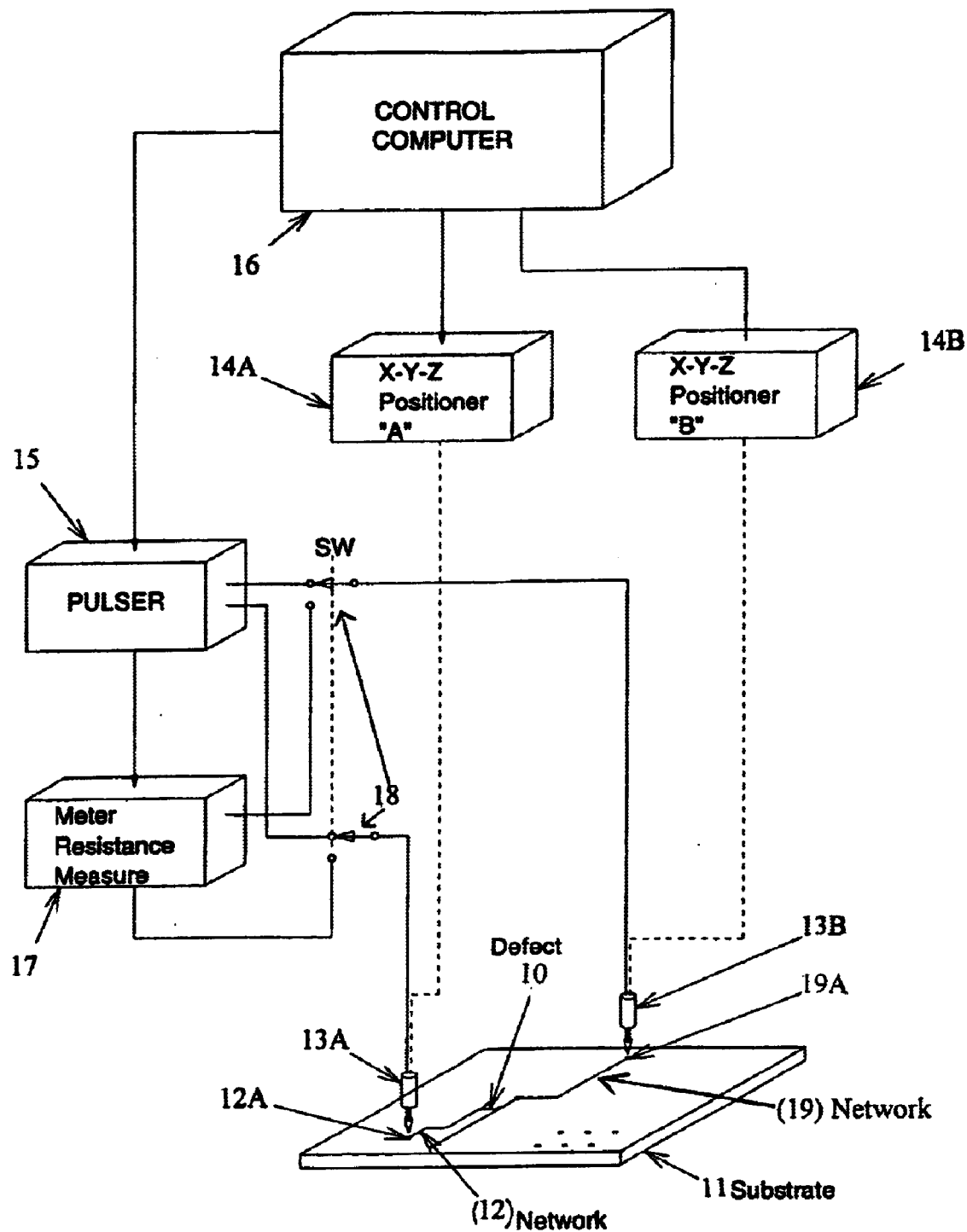
FIG. 1 is a schematic diagram of a conventional system for attempting to repair shorts detected in an interconnect package.

Referring now to the drawings, and more particularly to FIG. 1, a conventional technique using defect data information obtained from an external source is illustrated. Typically, this might be serialized defect data from a host system that was originated at a previous test operation. The defect 10 in this illustration is on substrate 11 and was determined to be an uninterrupted connection between one network 12 and another network 19, as measured between test point 12A and test point 19A. The two serial x,y probes 13A, 13B are positioned on nodes 12A, 19A, respectively, by x,y,z positioners 14A, 14B. The pulser 15 then is fired by control computer 16 and the short 10 removed, if it is repairable. The removal is verified using meter 17. Switch 18 allows the operator to manually switch between the pulsing and testing operations.

Figure 2:
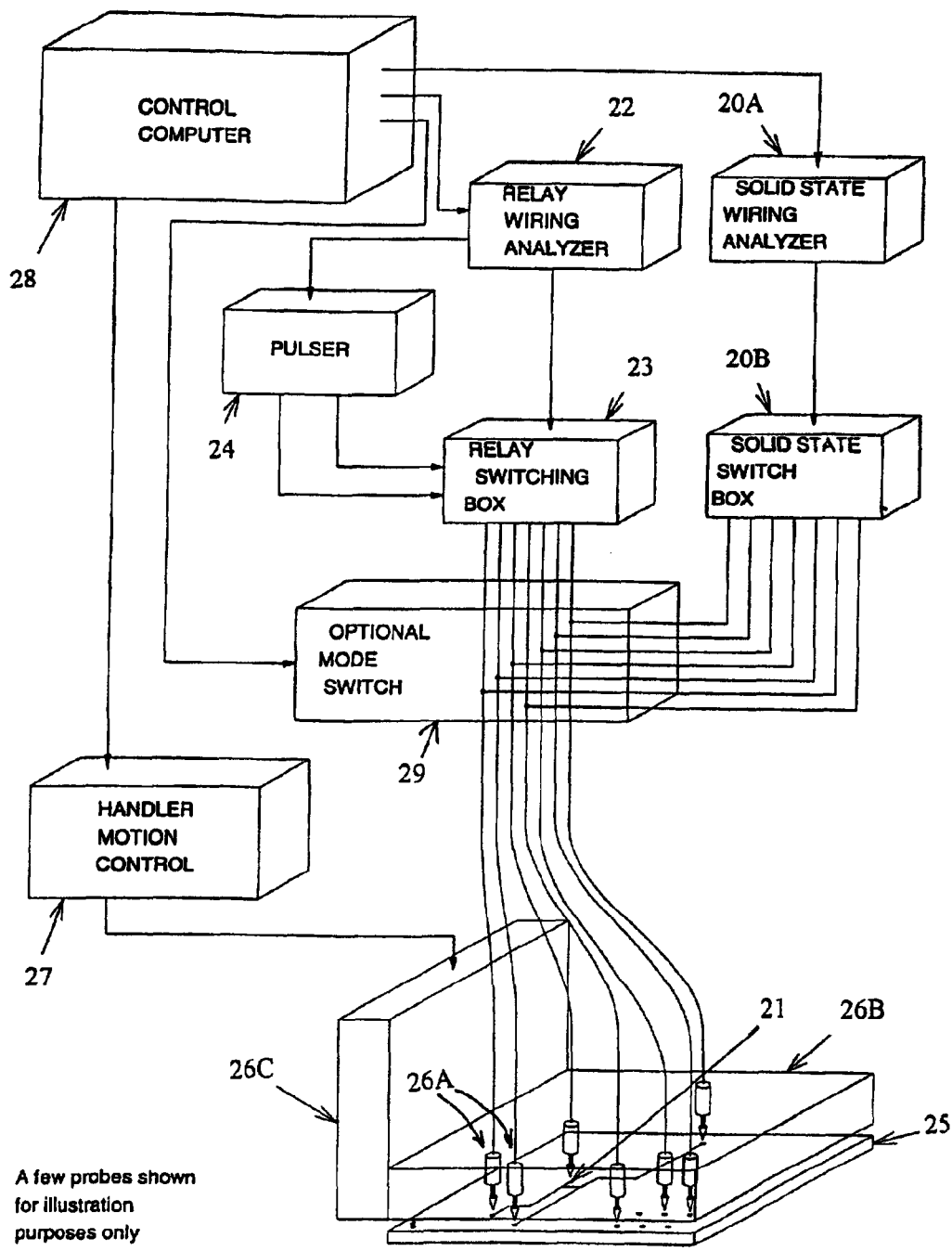
FIG. 2 is a schematic diagram illustrating an exemplary embodiment of the invention.

As an exemplary example shown in FIG. 2, this invention uses an existing solid state wiring analyzer system to set up an electrical path in order to perform an "electrical pulsing" operation on a packaging product used to connect electrical signals from chip to chip. Testing is normally performed on this type of product in order to test for "opens" (connection required but not present) and "shorts" (unwanted connections). A repair "pulsing" process exists to repair these shorts by over stressing the defect with a high current and voltage for a short time. The specific current and voltage values depend significantly upon the material set involved, i.e., conductor and dielectric. Typical values are less than 10 to 20 amps, with less than 100 volts compliance, for a few hundred micro seconds, although other combinations of current, voltage, waveform and duration may be chosen to optimize the success of the shorts repair process and would be easy for one of ordinary skill in the art to select based on the specific device under test.

The solid state wiring analyzer 20A is one optional method to locate the defect 21, and is a desirable option because of its faster speed relative to the relay analyzer 22. Relay analyzer 22 and switching box 23 are used to set up the current path, via relays, for a current pulse from current pulser 24 to repair the defect 21 shown on packaging product 25.

A plurality of cluster probes 26A is contained in block 26B and connected to handler fixturing 26C with a z-motion control. It is noted that FIG. 2 shows a few probes for illustration purposes only. The z-motion control along with x-, y-motion, if required, is controlled through handler motion control box 27. X-,y-motion is motion parallel to the plane of the surface of the interconnect product. Z-motion is motion orthogonal to the plane of the surface of the interconnect product. The relay analyzer 22, solid state analyzer 20A and handler motion control 27 "handshaking" and protocol is sequenced through control computer 28. Depending upon the type of solid state switching 20B used and the current/voltage values of the pulser 24, optional mode switch 29 could be used to isolate the solid state switching to prevent damage caused by the pulse. Normally, this isolation is not required when the impedance of the solid state switching is high in a non-active state. If test scanning time is not a concern, then the relay analyzer 22 could also be used to test and locate the defect. The purpose of the solid state scanning is to test at a much higher rate than the relays will provide.

Both analyzers 20A, 22 are electronic units with circuits capable of selecting an appropriate path through the switching matrix, which may also be called a multiplexer, and also of providing an electrical stimulus to a net, trace or circuit in the device under test (e.g., usually an electronic packaging structure such as a ceramic substrate or printed circuit board) and of measuring the response. Typically, this means applying a voltage between two circuits which are designed to be isolated from each other and measuring the current which flows. If the current is above a predetermined acceptable level, then the circuits are considered to be "shorted". To measure continuity, a current is applied to circuit elements which are expected to be electrically connected and the voltage across the elements is measured. If the voltage exceeds a predetermined level, the circuit under test is considered to be "open".

In the exemplary implementation, the solid state switching matrix is connected to the relay matrix through a printed circuit which connects one channel on the solid state matrix to a corresponding channel on the relay matrix and then to wiring which is connected to one probe contact within the cluster probe fixture.

The optional electrical function referred to as an "Optional Mode Switch" (29) could be used to electrically connect either the solid state matrix or the relay matrix to the cluster probe, while isolating the solid state matrix from the relay matrix, so that the high energy pulse switched through the relay matrix does not adversely affect the solid state matrix. The control computer 28, in the exemplary implementation, preferably is a personal computer programmed to act as a "supervisor" or "director", essentially controlling the functions of the devices connected to it such as the solid state switching matrix, the robotic (x,y,z) controller, and any other devices in various possible embodiments of the apparatus requiring controlled functions.

Both relay wiring analyzer 22 and solid state wiring analyzer 20A are shown in the embodiment in FIG. 2. In this embodiment, the relay analyzer 22 is available as a lower speed wiring analyzer. It additionally serves as the primary interface to the pulser 24, since currents and voltages would normally be at levels too high for the solid state wiring analyzer. However, depending upon the product being analyzed, it is easy to recognize that a pulsing operation at lower energy levels could be incorporated as an interface to the solid state wiring analyzer 20A and that such interface would benefit from the faster speed of the solid state module.

In the embodiment in FIG. 2, both the relay wiring analyzer 22 and the solid state wiring analyzer 20A include a controller having a program controlling operation for the specific product under test. An alternate control technique might include, for example, the program instructions in the control computer 28, thereby allowing the relay wiring analyzer 22 and/or solid state wiring analyzer 20A to be much simpler modules, albeit at the expense of additional programming for the control computer 28.

Figure 3:
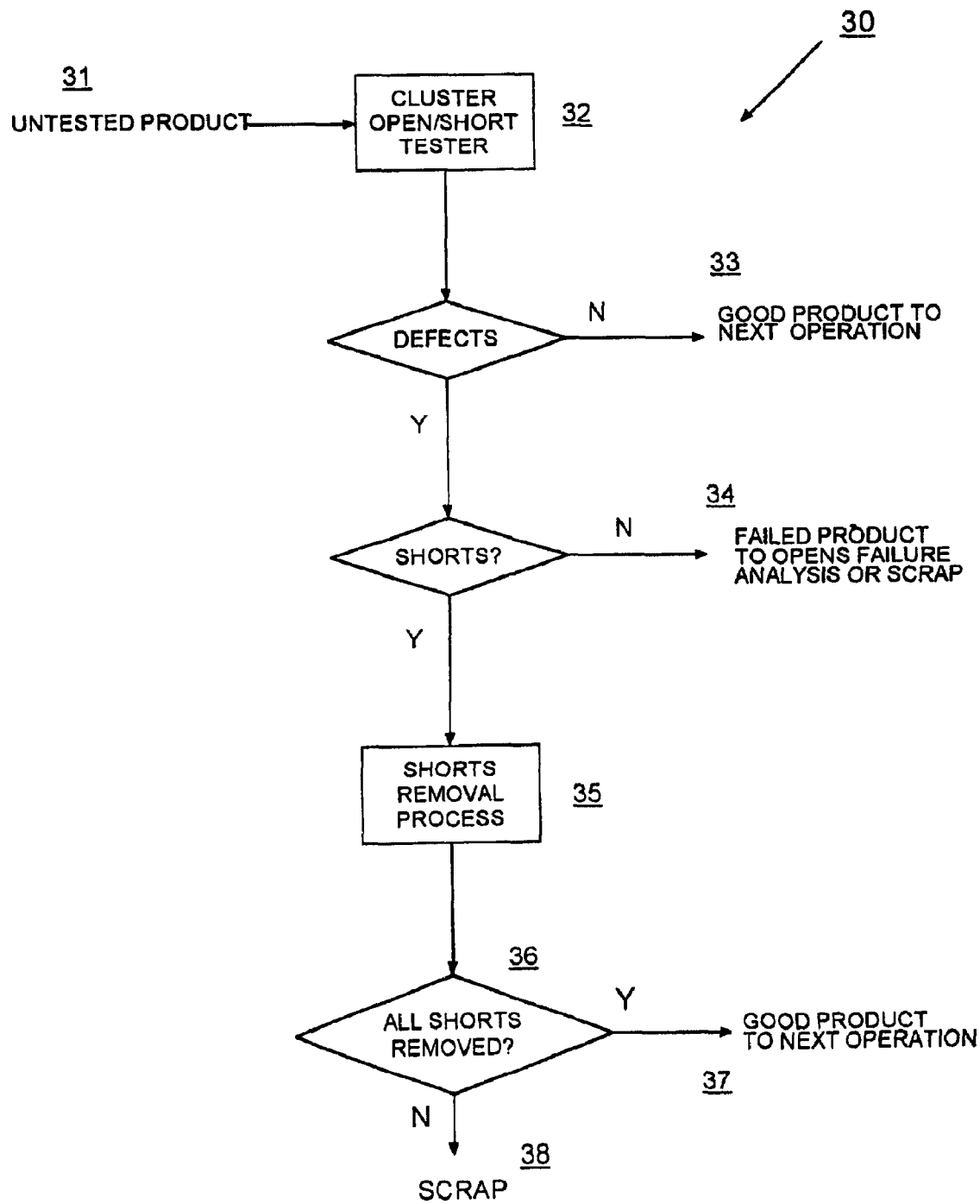
FIG. 3 illustrates a process 30 for shorts removal product disposition.

FIG. 3 shows a process 30 for the shorts removal product disposition. In step 31, an untested product is positioned below the cluster fixture. The test program included in the solid state wiring analyser 20A (or relay wiring analyzer 22) is exercised in step 32 to detect opens or shorts. The product is completely tested for opens and shorts before any attempts at removal of a short are initiated.

If no defects are identified, then the product moves in step 33 to the next operation. If only opens are identified (step 34), the product is discarded or moves to a test station to analyze the opens. If only shorts remain, then the shorts removal process is initiated in step 35 in an attempt to eliminate all shorts (step 36). If the shorts removal process is successful, then a high voltage is optionally applied to the product's elements which were formerly shorted to accelerate any re-growth of the shorts. Such re-growth of the short can be detected by testing the resistance of the former short. If no re-growth is detected, then the entire product is 100% tested and if it now passes the 100% open and shorts test procedure, it is considered good (step 37) and moves to the next operation. If any shorts remain that cannot be eliminated (step 38), then the product is discarded or subject to further analysis to isolate the reason.

Figure 4:
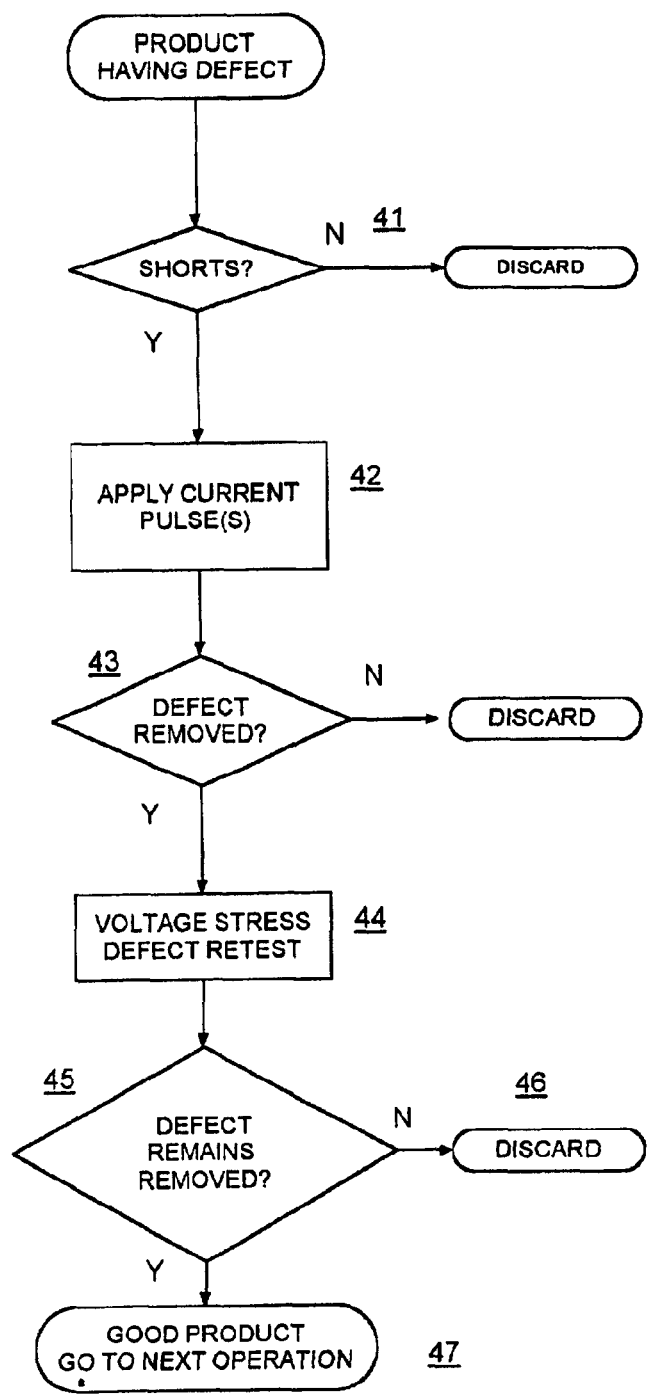
FIG. 4 illustrates a process for shorts removal product disposition when the product has been detected as having a defect.

The shorts removal process is shown in FIG. 4. The product is identified in step 32 of FIG. 3 to contain at least one defect. If none of the defects is due to shorts, then the product moves out in step 41 either to be discarded or to have the open defects further analyzed at another test station. If a short is identified, then a set of current pulses is applied (step 42) in an attempt to eliminate the short. The individual current pulses ramp up from a low current level and increase to a maximum. Some shorts are removed at relatively low current values while others require higher levels, and some cannot be removed at all.

If the short cannot be eliminated after a predetermined series of attempts, then the product leaves (step 43) either to be discarded or further analyzed. If the short has been eliminated, then a predetermined series of retesting is initiated (steps 43, 44, 45), including an optional voltage stress (step 44) to assure isolation quality of the eliminated short. The overvoltage stress depends upon material set such as conductor and dielectric type. Typically, this voltage stress will guarantee that no re-healing of defect can be expected.

If at least one short remains that cannot be eliminated, then the product is removed either to be discarded or for further analysis (step 46). Finally, if all shorts are eliminated, the product is considered good in step 47 and moves to the next operation.

While this description demonstrates some of the essential features of the invention, it would be obvious to one of ordinary skill in the art that variations are possible, including configurations based on the variations and options mentioned above. Some of these possible variations are mentioned below.

The invention will work for any customized current/voltage application designed for any specific or given material set (conductor and dielectric). For example, it is applicable to, but not restricted to, alumina/moly, glass/copper, tungsten/alumina and other combinations of insulator/conductor, and possibly to combinations of insulators/conductors/semiconductors. It can be used on any interconnect system in which an energy pulse can possibly dissipate a short or unwanted connection.

The technique will work with or without the solid state switching. The relay matrix can be designed to do both functions (i.e., test and then set up the pulse path). However, the relay testing speed would be much slower than the solid state switching. Use of a solid state system is more efficient as the cluster probe count increases.

As mentioned above, the matrix solid state or relay wiring analyzer system could provide a timed stress voltage on a repaired defect to assure that the defect does not re-heal after an initial successful repair.

The system can operate in a number of modes, as follows:

A. Repair only: the defect is detected on another tester and defect data is transmitted via host or equivalent media to the repair/test system and the pulsing path is set up through the relays and the pulsing repair performed. A solid state matrix would not be used and the technique most probably would require some form of product serialization.

B. Test only: if product repair is not desired, then this system will operate with the repair mode inactive and only the testing operation performed.

C. Shorts test repair mode: the product is tested for shorts only and then repaired and the repair verified. Then, the product is delivered to another tester for "complete" final open/shorts testing.

D. Repair product with shorts: the product is tested on another machine and it is determined to have shorts, but the location(s) are not known. A shorts test only is performed, the defect is subjected to the pulse repair process, then a complete open/shorts performed, and the good product is then moved to the next operation.

E. Complete test/repair: retest and move to the next operation. Untested parts are tested and then all shorts repaired and the product completely retested for opens and shorts. Good products are moved to the next operation following successful retesting.

These potential different modes are important depending upon application and product, i.e., PC board versus substrates such as Single Chip Modules (SCM), or Multi Chip Modules (MCM). PC boards may be contacted and tested from one side or both sides, and any of the five modes could apply. Inexpensive shorting pads used for opens test that contact the chip mounting surface can be used on SCMs, thereby making attractive mode E described above. More expensive chip mounting cluster probes could be used for MCMs to operate in mode E. However, one of the other modes used in this system would inexpensively repair I/O shorts only and improve yields in an inexpensive and efficient manner.

Compared to the manually applied shorts repair method, utilizing hand-held probes to make contact to the circuit elements, the invention has the following advantages:

1. An "all in one" tester and shorts removal system is more efficient (i.e., it requires fewer process steps) as seen from the perspective of the test/repair operator.

2. A time and motion study has shown that the invention takes less time than the manual process.

3. The skill level which the test/repair operator must have is considerably lower when using the invention, as compared to the manual shorts removal process. The manual process requires the operator to manually place sharp probes on the correct I/O pair of pads, plated through holes, or vias. These probes may be positioned with respect to the interconnect product using manually adjusted "x,y,z micropositioners" which translate a rotary motion of a lead screw into a linear, translational motion. The probes may alternatively be hand held. The manual process requires a high level of hand-eye coordination. It is also important that the operator not have the sharp probes skate or slide on the I/O pads as such movement could inflict damage which would cause the product to be rejected and discarded at a subsequent visual inspection operation.

4. The invention includes a high voltage stress of the former shorts, improving the reliability of product shipped to end users. Such a voltage stress can not be manually applied using hand-held probe due to the risk to the health of the test/repair operator.

While the invention has been described in terms of a single preferred embodiment, those skilled in the art will recognize that the invention can be practiced with modification within the spirit and scope of the appended claims.

What is claimed is:

1. An electronic circuit wiring interconnect package test and repair apparatus, comprising:
    a wiring analyzer to locate shorts between conductors, said conductors being on a surface of or embedded in a carrier substrate, said conductors being intended to interconnect components to be mounted on said carrier substrate to form a circuit, said carrier substrate being devoid of all said components, wherein said wiring analyzer is a selected one of a first wiring analyzer having a first speed of operation and a second wiring analyzer having a second speed of operation;
    a current source to provide current sufficient to remove said shorts; and
    a cluster probe, comprising a plurality of probes, to contact said conductors in a manner controlled by said wiring analyzer.

2. The test and repair apparatus of claim 1, wherein said first wiring analyzer comprises a relay wiring analyzer and said second wiring analyzer comprises a solid state wiring analyzer.

3. The test and repair apparatus of claim 1, further comprising a controller for automatic positioning of said cluster probe.

4. The test and repair apparatus of claim 1, further comprising a controller having voltage stress test capability.

5. The apparatus of claim 4, wherein said voltage stress test is executed prior to moving said cluster probe, and, prior to moving said cluster probe, said controller uses said at least one wiring analyzer to again locate shorts between said plurality of conductors.

6. The test and repair apparatus of claim 1, further comprising a controller to automate at least one of said locating of said shorts and said removing of said located shorts.

7. The test and repair apparatus of claim 6, wherein said controller performs a plurality of attempts to remove said shorts.

8. The test and repair apparatus of claim 1, wherein said at least one wiring analyzer additionally locates open circuits that are defects in said carrier substrate.

9. The apparatus of claim 1, further comprising:
    a controller to control said wiring analyzer and to control said current source,
    wherein said controller controls said wiring analyzer to perform an analysis of all said conductors contacted by said cluster probe prior to attempting to remove any located short circuit and said attempt to remove short circuit occurs without moving said cluster probe.

10. The apparatus of claim 9, wherein, after attempting to remove said located short circuits and prior to moving said cluster probe, said controller thereafter uses said at least one wiring analyzer to again locale abnormal shorts between said plurality of conductors.

11. A method of testing and repair of wiring interconnect packages, comprising:
    contacting, at a predetermined set of locations, a wiring interconnect package under test, using a cluster probe containing a plurality of probes;
    applying a predetermined set of voltage levels in a predetermined sequence to predetermined probes in said cluster probe;
    measuring a response to each application of voltages to detect any abnormal open or short in said wiring interconnect package; and
    for any detected abnormal short, applying a predetermined current to attempt to remove said detected abnormal short,
    wherein said applying of current to attempt to remove said detected abnormal short and said measuring of a response to detect any abnormal open or short uses a same apparatus and said apparatus uses a selected one of two wiring analyzers for said applying a predetermined set of voltage levels and said measuring a response to each application of voltages, a first of said two wiring analyzers operating at a higher speed than a second of said two wiring analyzers.

12. The method of claim 11 wherein at least one of the following is automated:
    said contacting at a predetermined set of locations;
    said detecting of abnormal open or short; and
    said attempting to remove said detected abnormal short.

13. A method of automatically testing and repairing wiring interconnect packages, said method comprising:
    selecting one of a high-speed wiring analyzer and a lower-speed wiring analyzer on a test apparatus having both a test capability and a repair capability;
    contacting, at a predetermined set of locations, a wiring interconnect package under test, using a cluster probe containing a plurality of probes;
    automatically applying a predetermined set of voltage levels in a predetermined sequence to predetermined probes in said cluster probe;
    automatically measuring a response to each application of voltages to detect any abnormal open or short circuits in said wiring interconnect package; and
    for a detected abnormal short circuit, automatically applying a predetermined current to attempt to remove said detected abnormal short circuit.

14. The method of claim 13, wherein said detecting of any abnormal opens or shorts is executed at a first higher speed using a solid state switching module and said attempting to remove shorts is executed using a relay switching module.

15. The method of claim 13, wherein said contacting of said wiring interconnect package is additionally automatically actuated by a controller.

16. An apparatus for testing and repair of wiring interconnect packages, comprising:

a wiring analyzer to locate abnormal shorts between conductors, said conductors being on a surface of or embedded in a wiring interconnect package, said conductors being intended to interconnect components to be mounted on said wiring interconnect package to form a circuit, said wiring interconnect package being devoid of all said components, said wiring analyzer being a selected one of two wiring analyzers, a first of said two wiring analyzers operating at a slower speed than a second of said two wiring analyzers;

a current source to provide current sufficient to remove said abnormal shorts; and a cluster probe to contact predetermined locations on said wiring interconnect package.

17. The test and repair apparatus of claim 16, wherein said first wiring analyzer comprises a relay wiring analyzer and said second wiring analyzer comprises a solid state wiring analyzer.

18. The test and repair apparatus of claim 16, further comprising a controller to automatically position said cluster probe.

19. The test and repair apparatus of claim 16, further comprising a controller for a voltage stress test capability.

20. The test and repair apparatus of claim 16, further comprising:

a controller so that at least one of locating of said abnormal shorts and removing of said abnormal shorts is automated.

21. A signal-bearing medium tangibly embodying a program of machine-readable instructions executable by a digital processing apparatus to perform a method of testing and repair of wiring interconnect packages, said method comprising:

receiving an input indicating whether a testing is to be executed by a first wiring analyzer or a second wiring analyzer;

contacting, at a predetermined set of locations, a wiring interconnect package under test, using a cluster probe containing a plurality of probes;

applying a predetermined set of voltage levels in a predetermined sequence to predetermined probes in said cluster probe;

measuring a response to each application of voltages to detect any abnormal opens or shorts in said wiring interconnect package; and for a detected short between conductors, applying a predetermined current to attempt to remove said detected short, said conductors being on a surface of or embedded in said wiring interconnect package, said conductors being intended to interconnect components to be mounted on said wiring interconnect package to form an electronic circuit, said wiring interconnect package being devoid of all said components, wherein said applying of voltages and said measuring of responses to detect any abnormal shorts uses a same apparatus that is used for said attempt to remove said shorts and said apparatus incorporates a first wiring analyzer and a second wiring analyzer, wherein said first wiring analyzer operates at a speed different from a speed that said second wiring analyzer operates.

* * * * *